United States Patent
Takagi et al.

(10) Patent No.: US 7,670,729 B2
(45) Date of Patent: Mar. 2, 2010

(54) MEASUREMENT METHOD AND APPARATUS, EXPOSURE APPARATUS, AND DEVICE FABRICATION METHOD

(75) Inventors: Atsushi Takagi, Tochigi-ken (JP); Hideki Ina, Kanagawa-ken (JP); Koichi Sentoku, Tochigi-ken (JP); Hiroshi Morohoshi, Tochigi-ken (JP)

(73) Assignee: Canon Kabushiki Kaisha (JP)

( * ) Notice: Subject to any disclaimer, the term of this patent is extended or adjusted under 35 U.S.C. 154(b) by 1276 days.

(21) Appl. No.: 11/142,964

(22) Filed: Jun. 1, 2005

(65) Prior Publication Data
US 2005/0270504 A1 Dec. 8, 2005

(30) Foreign Application Priority Data
Jun. 4, 2004 (JP) ............................. 2004-166695

(51) Int. Cl.
*G03F 7/00* (2006.01)
(52) U.S. Cl. ............................. 430/30; 430/22; 430/311; 430/394; 430/397
(58) Field of Classification Search .................... 430/30, 430/394, 397, 311, 322, 22
See application file for complete search history.

(56) References Cited

U.S. PATENT DOCUMENTS

| | | | |
|---|---|---|---|
| 4,908,656 A | 3/1990 | Suwa et al. | |
| 5,434,026 A * | 7/1995 | Takatsu et al. | 430/30 |
| 5,666,205 A * | 9/1997 | Tateno et al. | 356/401 |
| 5,800,951 A | 9/1998 | Hashimoto | |
| 2005/0106479 A1* | 5/2005 | Geh et al. | 430/30 |

FOREIGN PATENT DOCUMENTS

| JP | 2682523 | 8/1997 |
|---|---|---|
| JP | 2696962 | 9/1997 |
| JP | 10308342 | * 11/1998 |

* cited by examiner

Primary Examiner—Kathleen Duda
Assistant Examiner—Caleen O Sullivan
(74) Attorney, Agent, or Firm—Rossi, Kimms & McDowell LLP

(57) ABSTRACT

A measurement method for measuring a distortion of a projection optical system that projects a pattern, used by an exposure apparatus that exposes the reticle pattern onto an object to be exposed, the measurement method includes the steps of a first exposing step for exposing a mark pattern onto the object to be exposed, the mark pattern having a mark on or near an optical axis of the projection optical system and a mark beside the optical axis, and being arranged at a position of the reticle, a second exposing step for only exposing a mark on or near the optical axis of the projection optical system in the mark pattern, measuring step for measuring a shape of the mark formed on the object to be exposed via the first and second exposing steps, and calculating step for calculating the distortion of the projection optical system from the shape of the mark measured by the measuring step.

5 Claims, 19 Drawing Sheets

110X

← X11

← X12

110X'

← X21

← X22

MEASUREMENT METHOD AND APPARATUS, EXPOSURE APPARATUS, AND DEVICE FABRICATION METHOD

BACKGROUND OF THE INVENTION

The present invention relates generally to a measurement method, and more particularly to a measurement method for measuring a distortion of a projection optical system used in an exposure apparatus for fabricating various devices including semiconductor chips such as ICs and LSIs, display devices such as liquid crystal panels, sensing devices such as magnetic heads, and image pick-up devices such as CCDs, as well as fine patterns used for micromechanics. The present invention is suitable for a measurement for distortion of a projection optical system of an exposure apparatus for exposing a pattern, for example, with line width of 100 nm and less.

Conventionally, during manufacturing, photolithography technology, a exposure apparatus using a projection optical system to project a circuit pattern formed on a reticle (mask) onto a wafer, etc., has been employed for transferring the circuit pattern of fine semiconductor devices such as semiconductor memory and logic circuit.

The minimum critical dimension transferred by the projection exposure apparatus or resolution is proportional to the wavelength of light used for exposure and inversely proportional to the numerical aperture ("NA") of the projection optical system. The shorter the wavelength is, or the higher the NA is, the better the resolution. Thus, along with recent demands for finer semiconductor devices, shorter ultraviolet light wavelengths have been proposed—from an ultra-high pressure mercury lamp (I-line with a wavelength of approximately 365 nm) to KrF excimer laser (with a wavelength of approximately 248 nm) and ArF excimer laser (with a wavelength of approximately 193 nm). In recently, $F_2$ laser (with a wavelength of approximately 157 nm) has been developed for a next light source.

On the other hand, high superposition accuracy has been required when it comes to satisfying the fine processing of a circuit pattern. There is a distortion (a distortion aberration) in a projection optical system of an exposure apparatus that deteriorates superposition accuracy, and it is necessary to suppress a distortion in a projection optical system so as to improve superposition accuracy along with a fine processing in the future.

In a recent lithography, a pattern with a line width of 100 nm or less is formed. The pattern of the nanometer order may have different problems in a conventional definition (see, "Offside" of "Oplus E", published by New Technological Communications Company, issued in March 2003). Especially, a distortion causes acute problems by changing a line width when superposition accuracy is improved.

In a definition of the distortion by Zaidel, a principal ray as a center of light has a crossing position on an image surface (i.e., a displacement of an entire point on the image). Therefore, the distortion does not change even if a line width of an image formation changes.

However, a projection optical system for projecting an image of a reticle pattern has little coma aberration because of a design value and a manufacturing error. In other words, the image that is imaged by the projection optical system distorts and becomes asymmetric because of the coma aberration, and shifts from an ideal position that is without the coma aberration. The amount shifted from the ideal position that is without the coma aberration is an actual distortion (i.e., not a definition of Zaidel). Therefore, when the line width of the pattern changes, an influence by the coma aberration is different depending on the line width because an angle of diffraction light is different. A position of the image is also different because a distortion of the image is different. Thus, an actual distortion is different for each line width.

When an NA of a projection optical system changes, the coma aberration also changes. In this time, if the line width changes, an influence by the coma aberration is different depending on the line width because an angle of diffraction light is different. A position of an image is also different because a distortion of the image is different. Thus, an actual distortion is different for each line width.

Further, the projection optical system has the actual distortion when it has a little spherical aberration of, for example, about λ/10, results in a poor uniformity of an illumination optical system that illuminates a reticle pattern. When an exposure apparatus has various illuminating modes, the distortion is different for each of line widths in each of the illuminating modes.

Thus, a distortion is generated, and superposition accuracy is deteriorated when a line width of the formed circuit pattern changes.

However, a conventional superposition inspecting apparatus was not able to measure a distortion in the line width because a measurement principle of the conventional superposition inspecting apparatus adapts a characteristic of an image formation in an imaging optical system of a superposition inspecting apparatus and especially a method as "a bright field illumination+image data processing".

For example, when a numerical aperture (NA) is 0.9 or more, and a wavelength of light used is 300 nm, a minimum size of the line width that can be separated as a video signal is about 0.8 μm for a line and space in an image formation of the imaging optical system of the superposition inspecting apparatus. A pattern with 100 nm or less which is imaged in recent lithography cannot be finely imaged in a contrast.

In other words, a method that can inspect a measurement of a distortion in a projection optical system of an exposure apparatus that uses the pattern of 100 nm or less with highly accurate and a high throughput does not currently exist.

BRIEF SUMMARY OF THE INVENTION

The present invention is directed to a measurement method, a measurement apparatus, an exposure apparatus and a device fabrication method, the measurement method being able to inspect a measurement of a distortion in a projection optical system of an exposure apparatus that uses the pattern of 100 nm or less with highly accurate and a high throughput, and achieves a measurement of a distortion by a line width difference of the pattern of a projection optical system.

A measurement method of one aspect according to the present invention for measuring a distortion of a projection optical system that projects a pattern, used by an exposure apparatus that exposes the pattern of a reticle onto an object to be exposed, the measurement method includes the steps of a first exposing step for exposing a mark pattern onto the object to be exposed, the mark pattern having a mark on or near an optical axis of the projection optical system and a mark beside the optical axis, and being arranged at a position of the reticle, a second exposing step for only exposing a mark on or near the optical axis of the projection optical system in the mark pattern, measuring step for measuring a shape of the mark formed on the object to be exposed via the first and second exposing steps, and calculating step for calculating the distortion of the projection optical system from the shape of the mark measured by the measuring step.

A measurement apparatus of another aspect according to the present invention for measuring a distortion of a projection optical system that projects a reticle pattern and is used for an exposure apparatus that exposes the pattern onto an object to be exposed, the measurement apparatus includes a measurement mode for executing a measurement method, and wherein the measurement method for measuring a distortion of a projection optical system that projects a pattern, used by an exposure apparatus that exposes the reticle pattern onto an object to be exposed, the measurement method includes the steps of a first exposing step for exposing a mark pattern onto the object to be exposed, the mark pattern having marks on or near an optical axis of the projection optical system and marks without the optical axis, and being arranged at a position of the reticle, a second exposing step for only exposing marks on or near the optical axis of the projection optical system in the mark pattern, measuring step for measuring a shape of the mark formed on the object to be exposed via the first and second exposing steps, and calculating step for calculating the distortion of the projection optical system from the shape of the mark measured by the measuring step.

An exposure apparatus of another aspect according to the present invention for exposing a reticle pattern onto an object to be exposed, the exposure apparatus includes a projection optical system for projecting the pattern onto the object to be exposed, a measurement apparatus for measuring a distortion of the projection optical system, and an adjusting means for adjusting the projection optical system based on a measurement effect of the measurement apparatus, and wherein the measurement apparatus measures a distortion of a projection optical system that projects a reticle pattern and is used for an exposure apparatus that exposes the pattern onto an object to be exposed, the measurement apparatus including a measurement mode for executing a measurement method, and wherein the measurement method for measuring a distortion of a projection optical system that projects a pattern, used by an exposure apparatus that exposes the reticle pattern onto an object to be exposed, the measurement method comprises the steps of a first exposing step for exposing a mark pattern onto the object to be exposed, the mark pattern having a mark on or near an optical axis of the projection optical system and a mark beside the optical axis, and being arranged at a position of the reticle, a second exposing step for only exposing a mark on or near the optical axis of the projection optical system in the mark pattern, measuring step for measuring a shape of the mark formed on the object to be exposed via the first and second exposing steps, and calculating step for calculating the distortion of the projection optical system from the shape of the mark measured by the measuring step.

A device fabrication method of another aspect according to the present invention includes the step of exposing an object using an exposure apparatus, and performing a predetermined process for the object exposed, and wherein the exposure apparatus exposes a reticle pattern onto an object to be exposed, the exposure apparatus including a projection optical system for projecting the pattern onto the object to be exposed, a measurement apparatus for measuring a distortion of the projection optical system, and an adjusting means for adjusting the projection optical system based on a measurement effect of the measurement apparatus, and wherein the measurement apparatus measures a distortion of a projection optical system that projects a reticle pattern and is used for an exposure apparatus that exposes the pattern onto an object to be exposed, the measurement apparatus including a measurement mode for executing a measurement method, and wherein the measurement method for measuring a distortion of a projection optical system that projects a pattern, used by an exposure apparatus that exposes the reticle pattern onto an object to be exposed, the measurement method includes the steps of a first exposing step for exposing a mark pattern onto the object to be exposed, the mark pattern having a mark on or near an optical axis of the projection optical system and a mark beside the optical axis, and being arranged at a position of the reticle, a second exposing step for only exposing a mark on or near the optical axis of the projection optical system in the mark pattern, measuring step for measuring a shape of the mark formed on the object to be exposed via the first and second exposing steps, and calculating step for calculating the distortion of the projection optical system from the shape of the mark measured by the measuring step.

DETAILED DESCRIPTION OF THE PREFERRED EMBODIMENTS

Figure 1:
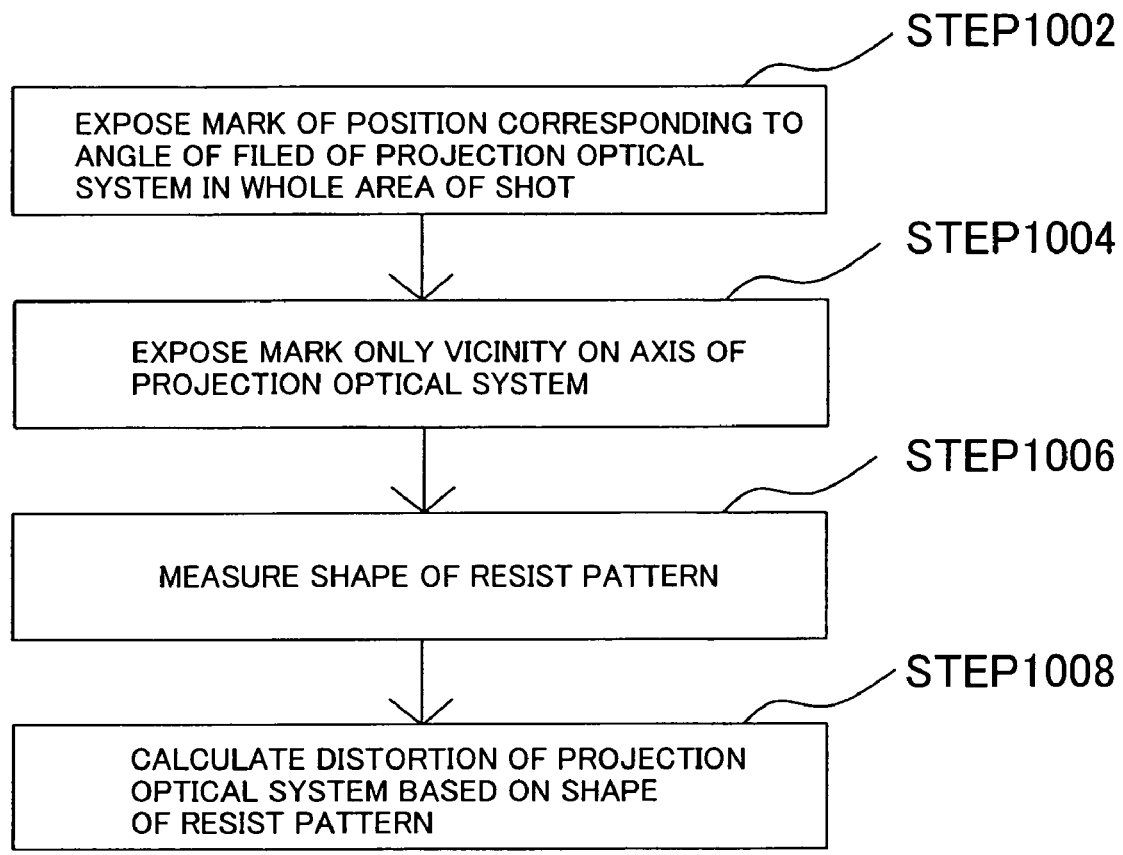
FIG. 1 is a flowchart for explaining a measurement method according to the present invention.

With reference to accompanying drawings, a description will now be given of a measurement method according to one aspect of the present invention. Here, FIG. 1 is a flowchart for explaining a measurement method 1000 of the present invention.

A measurement method 1000 is used for an exposure apparatus that exposes a reticle pattern onto an object to be exposed, and is for measuring a distortion (a misinterpretation aberration) of a projection optical system that projects the pattern onto the object. The measurement method 1000 can measure a distortion of a projection optical system by executing following steps (two special exposure sequences as described later) onto the object (i.e., a wafer where the photoresist is coated in this case).

First of all, a range (whole area of the shot) that can be exposed, i.e., for example, an area of 32×22 mm$^2$ is exposed by one time as a first exposure (step 1002). A pattern exposed by the first exposure is a mark pattern that has a mark at a position corresponding to a desired angle of field to be measured in a projection optical system. The mark pattern is arranged at a position at which reticle in an exposure apparatus is arranged and is exposed.

Figure 2:
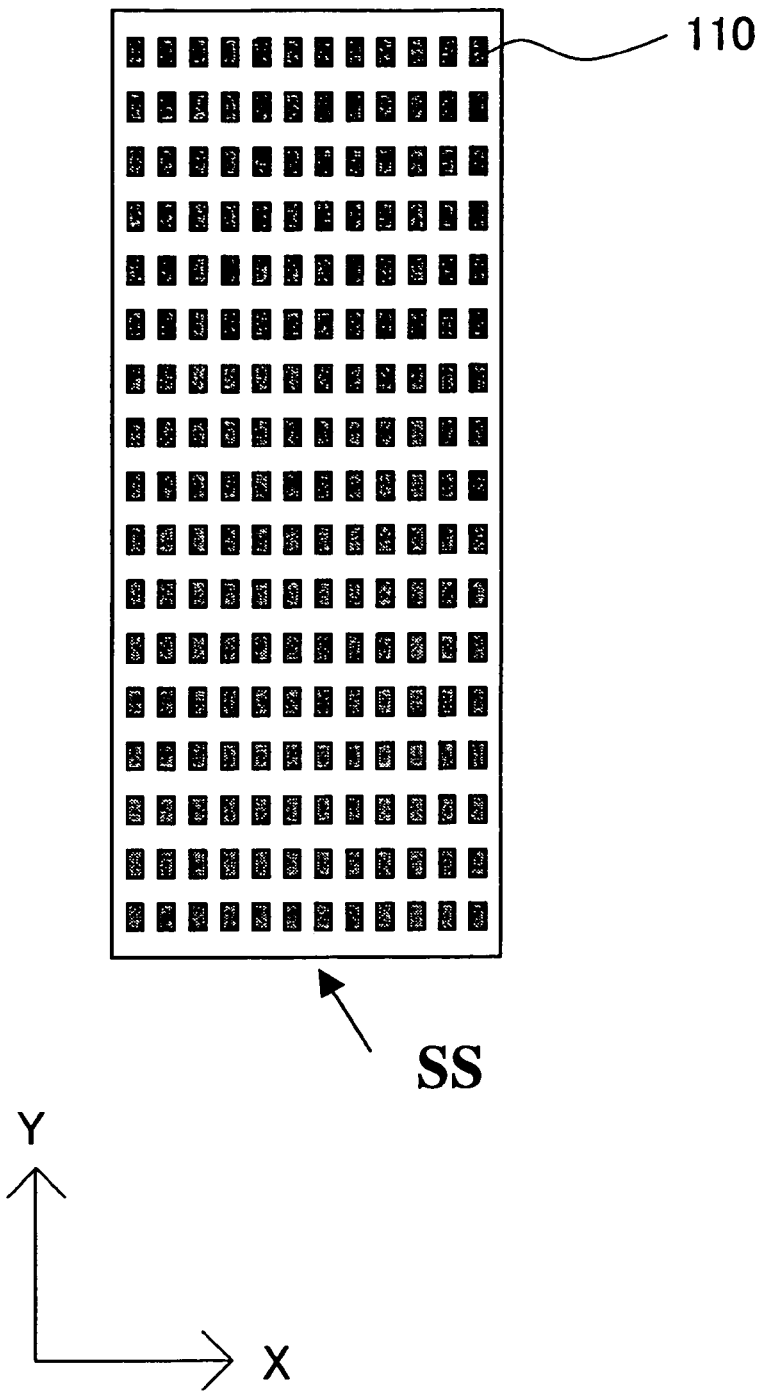
FIG. 2 is a schematic plane view for showing one example of a mask pattern.

FIG. 2 is a schematic plane view of one aspect of a mark pattern 100. With reference to FIG. 2, the mark pattern 100 has marks 110 of 12 pieces in a direction of X marks 110 and marks 110 of 17 pieces in a direction of Y at intervals of 2 mm in this embodiment. The marks 110 include two marks, two in X direction and two in the Y direction as described later. SS shows a shot size that is an area exposed by one time in FIG. 2.

Figure 3:
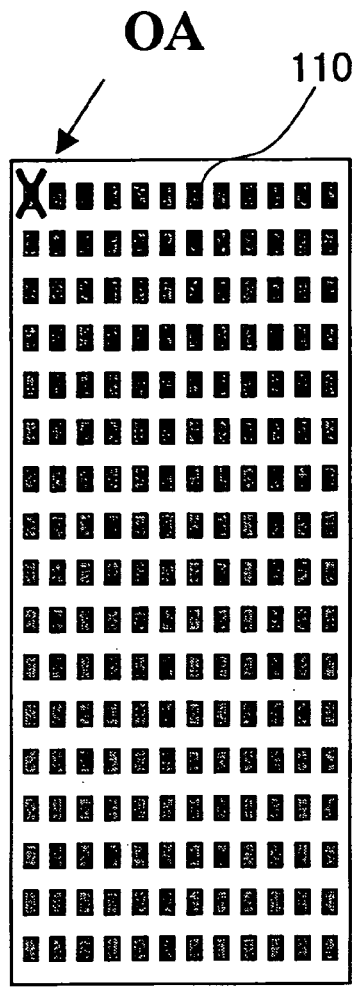
FIG. 3 is a view for explaining exposure of only a mark of a mark pattern arranged on or near an axis of a projection optical system.
Figure 3:
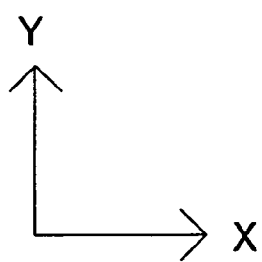
Figure 4:
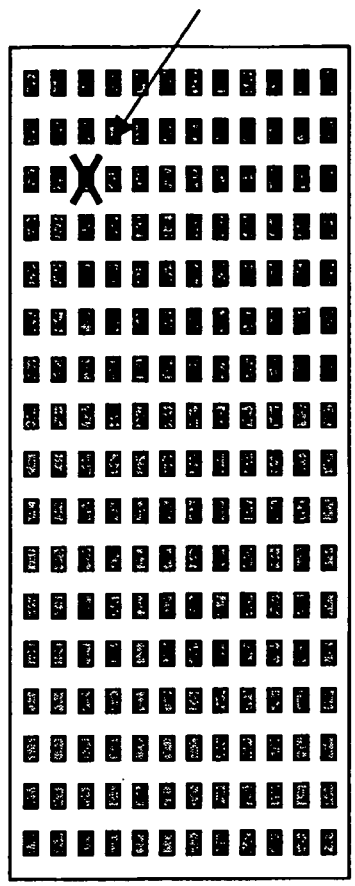
FIG. 4 is a view for explaining exposure of only a mark of a mark pattern arranged on or near an axis of a projection optical system.

Next, a reticle stage controlled by an interference measurement system is driven, the mark pattern 100 is moved, and the marks 110 of the directions of XY only arranged on or near an axis of a projection optical system are exposed as a second exposure (step 1004). For example, an angle of field (a sign of X) on higer the left side of FIG. 3, i.e., only a vicinity of an optical axis OA of the projection optical system is exposed. Further, for example, an angle of field (a sign of X) on a left side to lower the right side of FIG. 4 is exposed after the reticle stage is driven. These processes are repeated, and all angles of fields within the range of 32×22 mm$^2$ are exposed at the first time. In this embodiment, the marks 110 of 204 pieces (i.e., 12 pieces (in the direction of X)×17 pieces (in the direction of Y)) for each 2 mm pitch are exposed. The wafer exposed by the first exposure and the second exposure is developed, and is assumed as the resist pattern. Here, FIGS. 3 and 4 are views for explaining the exposure of only the mark 110 of the mark pattern 100 arranged on or near the axis of the projection optical system.

It is not necessary to remove the wafer from an apparatus during the first exposure and the second exposure, and an exposure can be continuously executed. However, it is suitable to expose only mark 110 at the vicinity of the axis of the projection optical system by driving a masking blade arranged in an illumination system in the second exposure so as not to expose other marks by a mistake.

The mark pattern 110 is exposed onto a position corresponding to an amount of a distortion in each angle of field in the first exposure, and a shear amount of the second exposure is a value having only a distortion of an decentering error because the second exposure exposes only the mark 110 on the axis of the projection optical system. The shear amount in the second exposure is a distortion that contains both shears in the angle of field and in the decentering error because the distortion of the decentering error influences all angles of fields.

Then, the amount of the distortion in the angle of field of the projection optical system can be calculated by subtracting a difference between an amount of a distortion of the center of an angle of field (i.e., area on or near the axis of the projection optical system) in the first exposure and an amount of each distortion. In other words, the shape of the resist pattern obtained in the first and second exposures is measured (step 1006), and the distortion of the projection optical system is calculated from the shape of this resist pattern (step 1008).

Thus, the measurement method 1000 can calculate the distortion in each angle of field of the projection optical system though it depends on driving accuracy of the reticle stage.

Figure 5:
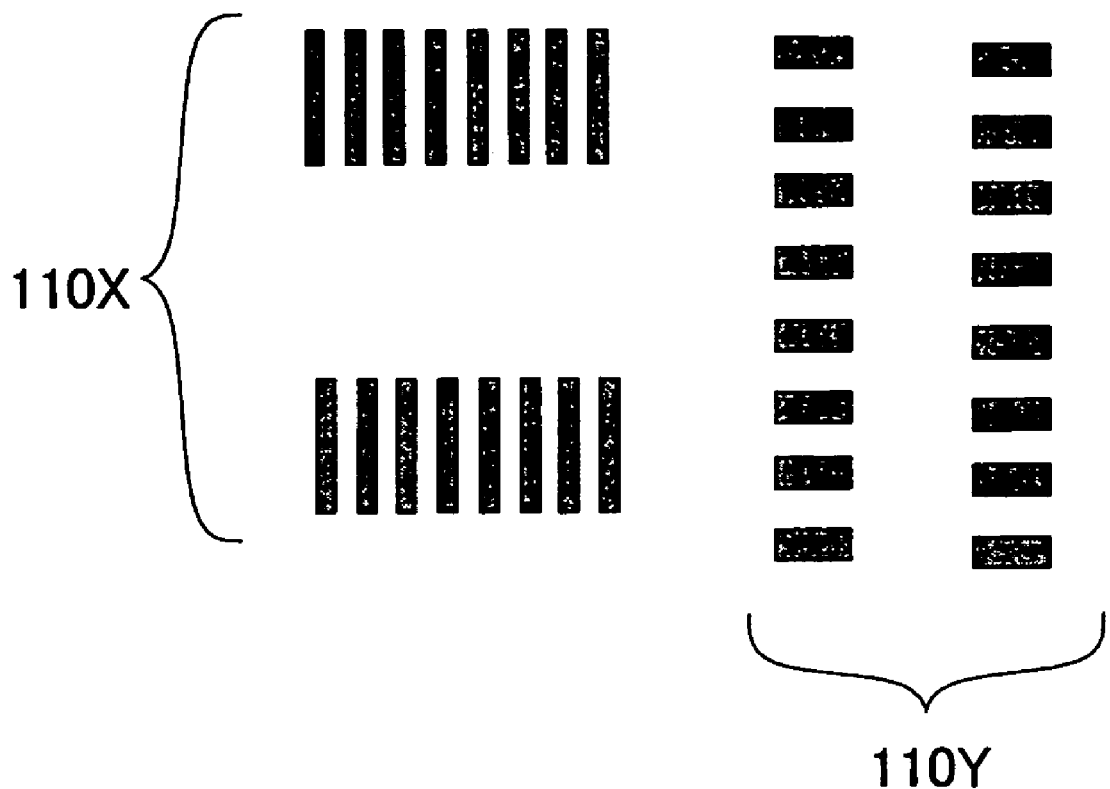
FIG. 5 is a schematic plane view for showing one example of a mark of a mark pattern.
Figure 6:
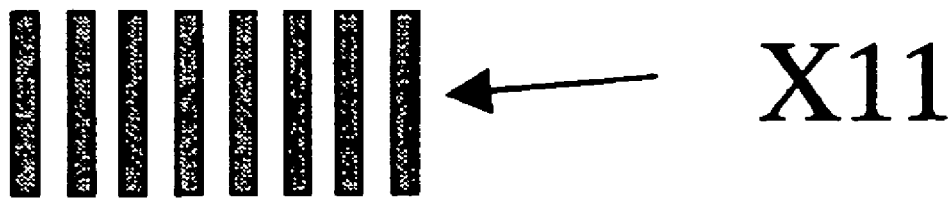
FIG. 6 is a schematic plane view for showing a mark (of a first exposure) including a grading in a direction of X.
Figure 6:
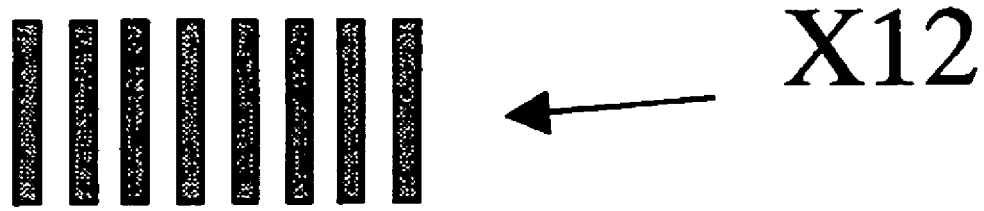

Hereafter, a description will now be given of the mark pattern 100. First of all, about the mark pattern 100 of the first exposure, two marks 110 of the grating shape of the same pitch are prepared in each direction of X (mark 110X) and Y (mark 110Y) as shown in FIG. 5 (it is 4 pieces in total in the directions of XY). Here, a description will now be given by using only the pattern 110X because the direction of X and the direction of Y are similar. The mark 110X of the grading shape in the first exposure is called a mark X11 and a mark X12 as shown in FIG. 6. Here, FIG. 5 is a schematic plane view for showing the mark 110 of the mark pattern 100. FIG. 6 is a schematic plane view for showing the mark 110X that has the grading shape in the direction of X.

Figure 7:
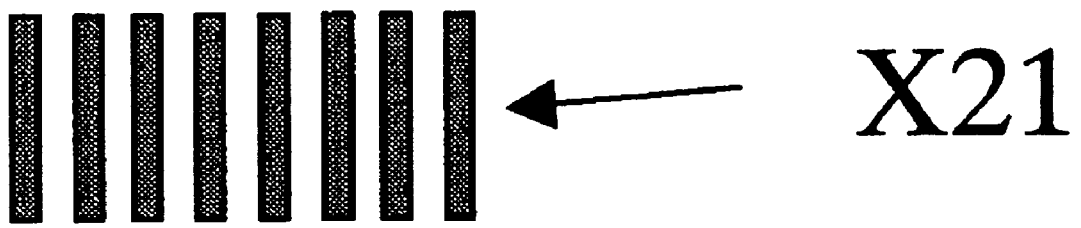
FIG. 7 is a schematic plane view for showing a mark (of a second exposure) including a grading in a direction of X.
Figure 7:
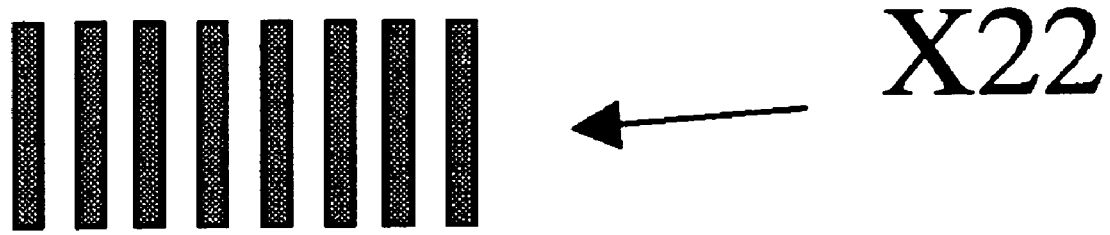

The two marks 110 of the grating shape of the same shape and pitch as well as the mark pattern 100 of the first exposure are also prepared (it is 4 pieces in total in the direction of XY) in the mark pattern of the second exposure. The mark 110X' that has the grading shape in the direction of X in the second exposure is called the mark X21 and the mark X22 showing in FIG. 7. Here, FIG. 7 is a schematic plane view for showing the mark 110X' that has the grading shape in the direction of X.

Although the marks X11 and X12 in the first and second exposures are the same composition as the marks X21 and X22 in the second exposure, a position between the marks X11 and X12 and a position between the marks X21 and X22 are shifted so that there are not superimposed even if they are ideally superimposed. Thus, the present invention can be achieved by the component.

Figure 8:
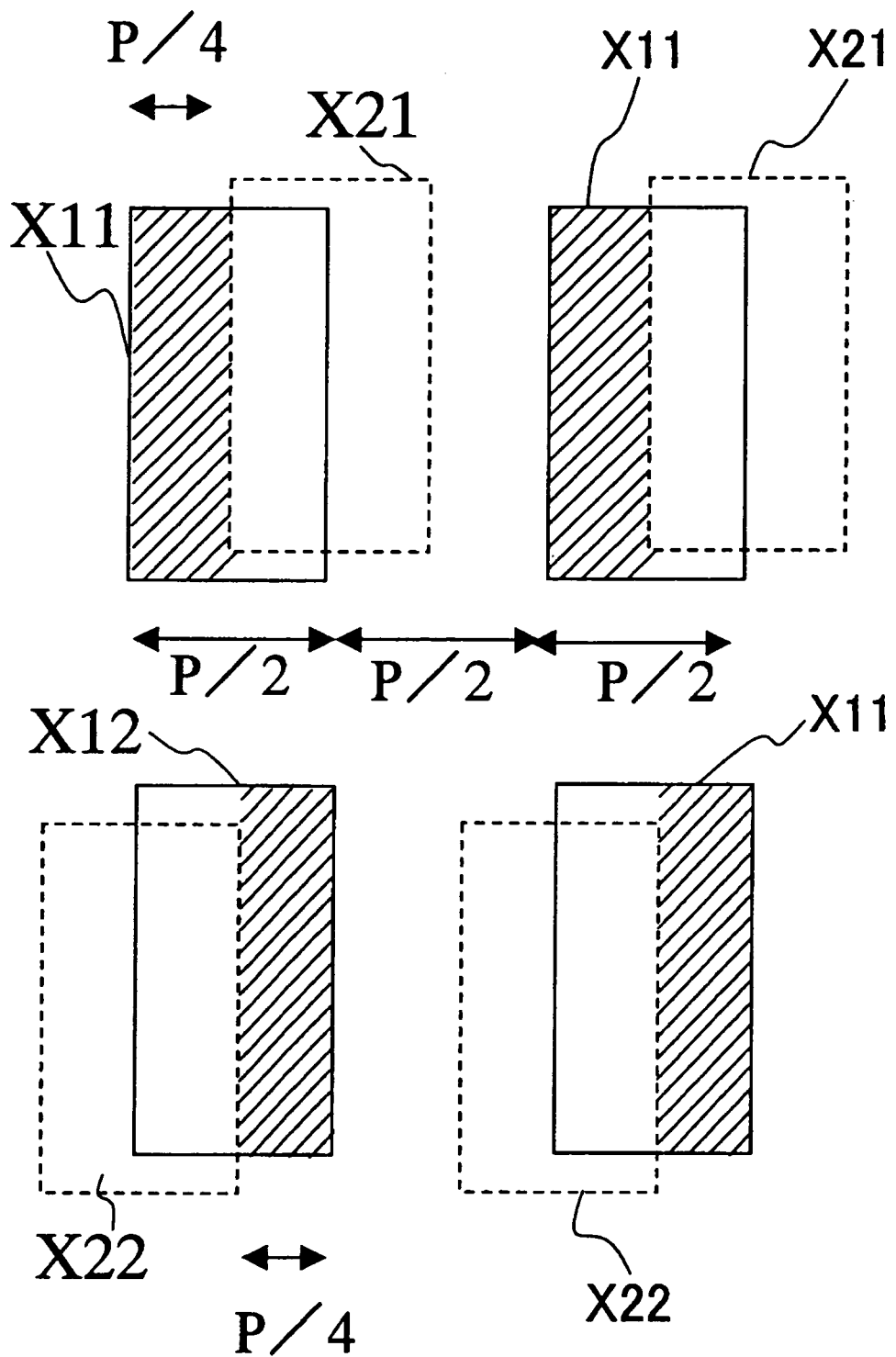
FIG. 8 is a view for explaining a relationship between a mark exposed at first time and a mark exposed at second time.

Referring to FIG. 8, a description will now be given of a relationship between the marks X11 and X12 in the first exposure and the marks X21 and X22 in the second exposure. P means the repetition pitch of each of marks X11, X12, X21 and X22 where the line and space is adjusted to 1:1, and P/2 means a width of each of marks X11, X12, X21 and X22 in FIG. 8.

In FIG. 8, a solid line marks the boundaries of the marks X11 and X12, and a broken line marks the boundaries of the marks X11 and X12. In this case, the marks X21 and X22 do not shift vertically relative to the marks X11 and X12 though they are shown as respectively shifted in the X and Y direction relative to the marks X11 and X12 in FIG. 8.

FIG. 8 indicates a case of an ideal superposition in which the alignment error or the distortion does not occur. The mark X21 exposed in the second time is shifted ¼ of the pitch P to the right direction in the mark X11 exposed at the first time. Similarly, the mark X22 exposed at the second time is shifted ¼ of the pitch P to the left direction in the mark X12 exposed at the first time.

In this embodiment, a photosensitive type of the photoresist is a positive type resist that is detached when developing it after a photosensitive. In a relationship between a penetration and a shading of each of the marks X11, X12, X21 and X22 (i.e., a mark pattern), the marks X11 and X12 (i.e., a part where resist exists after developing) are the shading parts, and the marks X21 and X22 (i.e., a part where resist does not exist after developing) are the penetration parts.

The marks X11 and X12, and the marks X21 and X22 are doubly exposed in FIG. 8. After it is developed, a resist will remain in a part where the marks X21 and X22, and the marks X11 and X12 are not superimposed (see a diagonal line in FIG. 8).

A line width of the mark X11 that is doubly exposed in the mark X21, and a line width of the mark X12 that is doubly exposed in the mark X22 have same line width P/4 in a case of an ideal superposition (i.e., an amount of shear is 0) in the developed resist (i.e., a pattern resist).

Figure 9:
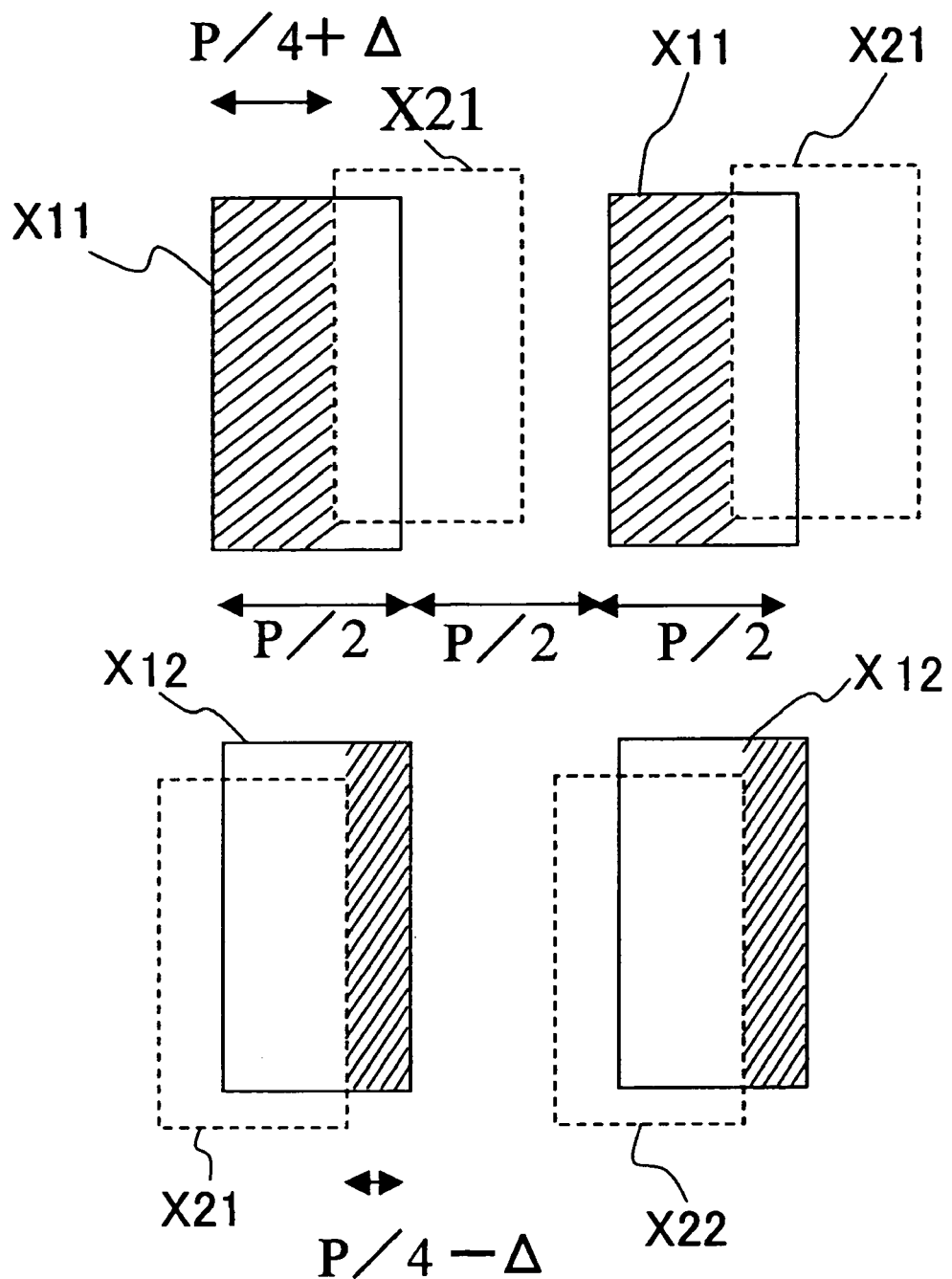
FIG. 9 is a view for explaining a relationship between a mark exposed in first time and a mark exposed at second time.

Next, FIG. 9 shows a relationship between the marks X11 and X12 exposed in the first time and the marks X21 and X22 exposed in the second time when a projection optical system with a distortion is used.

In the reference to FIG. 9, the projection optical system has the distortion, and the marks X11 and X12 exposed at the first time shifts in a left direction in the distortion amount $\Delta$ in a certain angle of field. Therefore, the mark X21 exposed in the second time shifts in a right direction in the distortion amount $\Delta$ of the mark X11 exposed in the first time, and the line width thickens by $\Delta$ after developing. On the other hand, the mark X22 exposed in the second time also shifts in the right direction by $\Delta$ of the mark X12 exposed in the first time, and the line width thins by $\Delta$ after developing.

Thus, an amount $\Delta$ of the distortion will be obtained by measuring each line width, and by calculating half of the difference because both line widths of the marks X11 and X12 respectively become P/4+P/4−$\Delta$. Therefore, the distortion in each angle of field is obtained by executing similar processing to a mark at a position corresponding to each angle of field of the projection optical system. In addition, it is possible to measure a distortion of the line width difference by changing a value of the pitch P of the mark.

Figure 10:
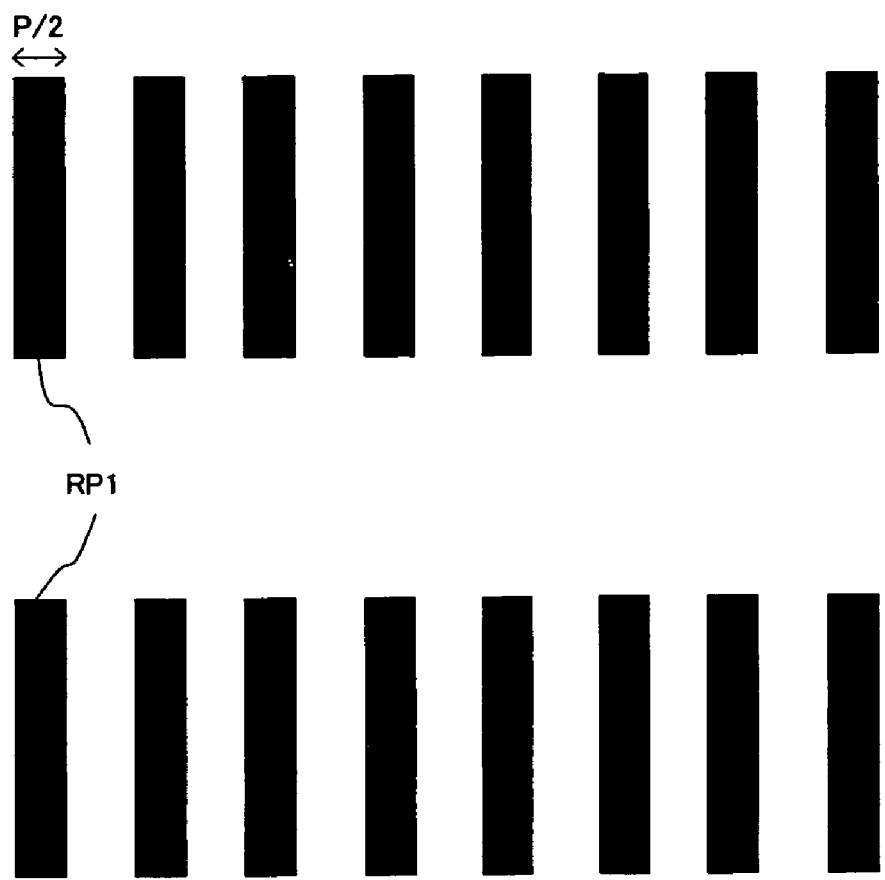
FIG. 10 is a schematic plane view for showing a resist pattern obtained by developing a mark exposed at first time.
Figure 11:
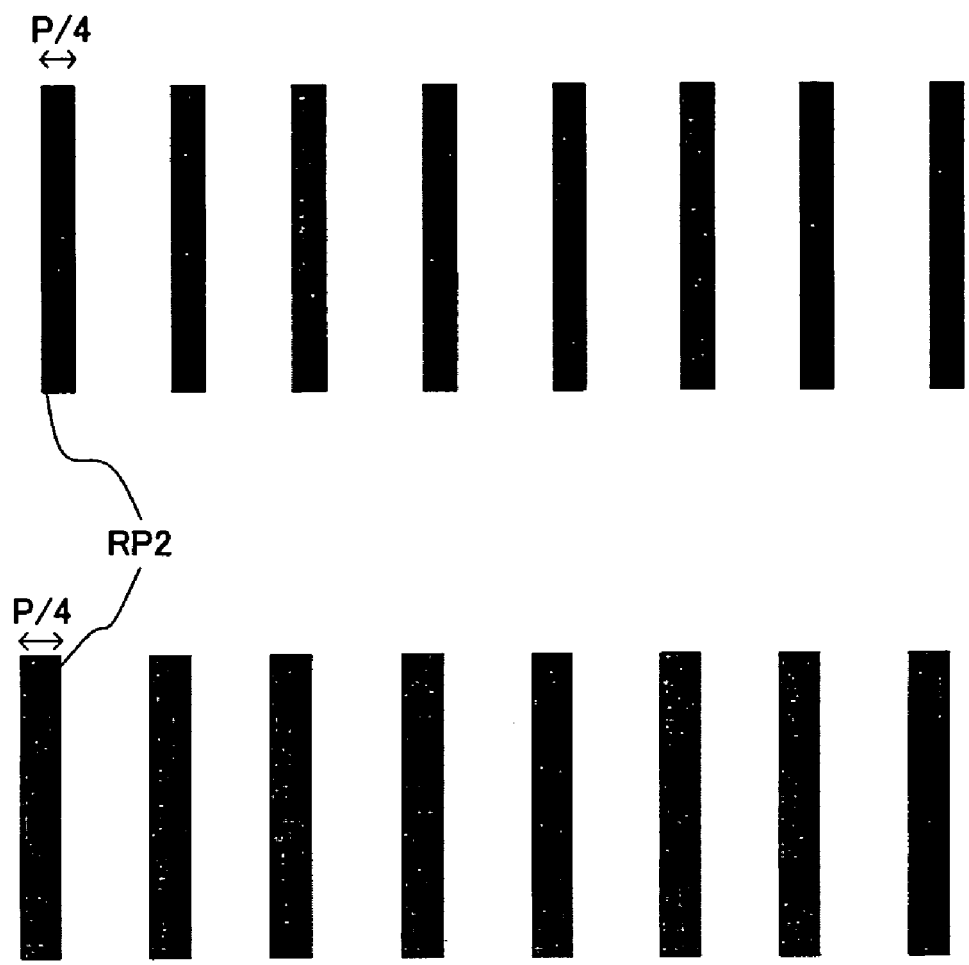
FIG. 11 is a schematic plane view for showing a resist pattern obtained by developing a mark exposed at first time and second time when a projection optical system does not contain a distortion.
Figure 12:
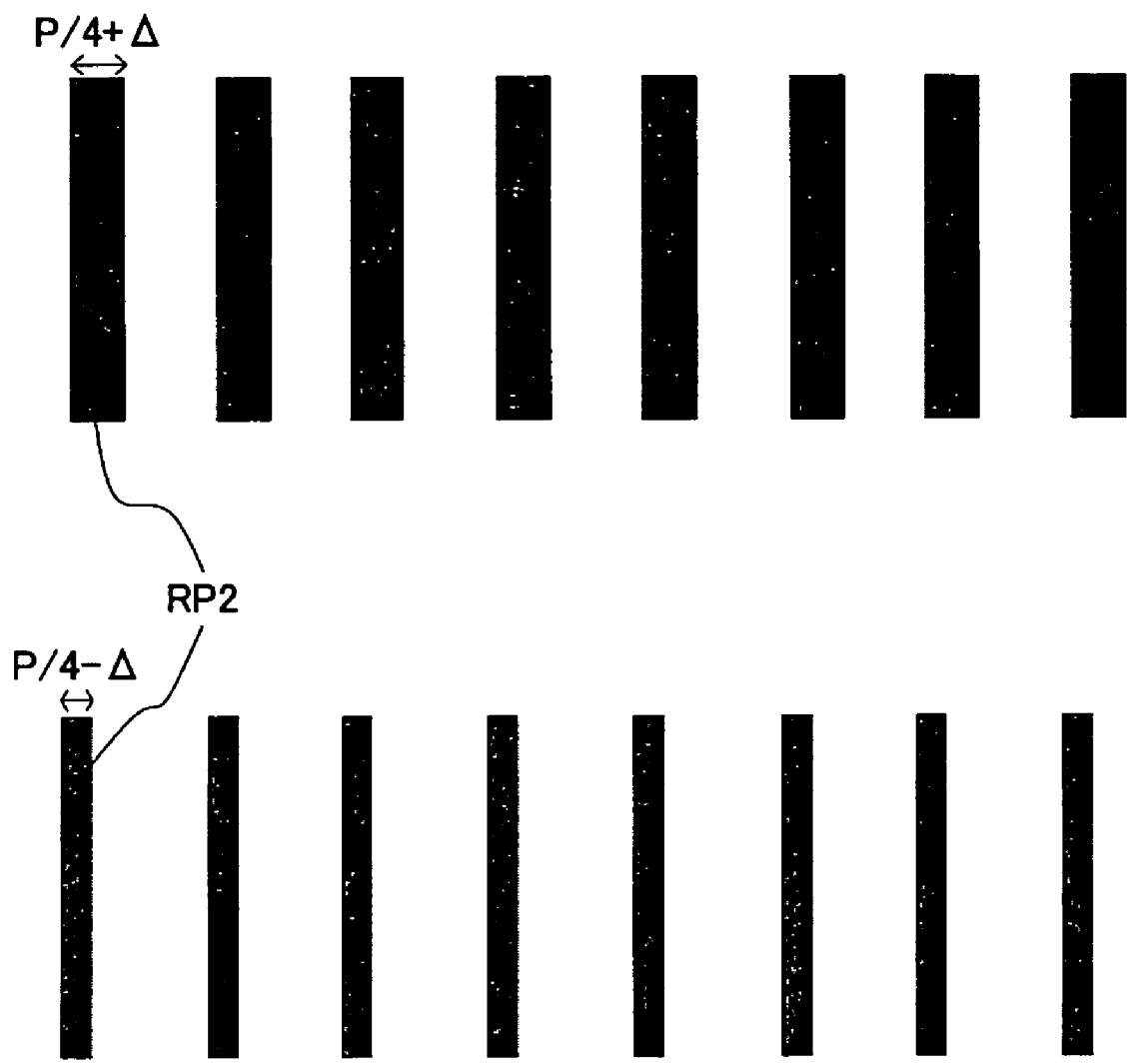
FIG. 12 is a schematic plane view for showing a resist pattern obtained by developing a mark exposed at first time and second time when a projection optical system contains a distortion.

FIGS. 10 to 12 show a resist pattern (i.e., a shape of an actual resist pattern) formed by the first and second exposures although FIGS. 8 and 9 show the marks X21 and X22 that shifted vertically relative to the marks X11 and X12.

FIG. 10 is a schematic plane view for showing a resist pattern RP1 (however, it does not exist when a distortion of a projection optical system is actually measured) obtained by developing the mark exposed at the first time. FIG. 11 is a schematic plane view for showing a resist pattern RT2 obtained by developing the mark exposed at the first time and second time when a projection optical system does not contain a distortion (i.e., there is no shear amount). FIG. 12 is a schematic plane view for showing a resist pattern RT3 obtained by developing the mark exposed to the first time and second time when a projection optical system contains a distortion (an amount $\Delta$ of a distortion).

Measuring the shape of the resist pattern shown in FIGS. 11 and 12 means to measure a shape of the mark formed on a wafer by the first and second exposures. A description will now be given of the measurement method as follows.

A method for measuring a shape of a resist pattern is possible when, for example, a spectrum ellipsometer and an interatomic force microscope etc. is used in case of a pattern with 100 nm or less like this embodiment.

First of all, a description will now be given of a method for using a spectrum ellipsometer. The method uses a device that is called a light Critical Dimension ("CD") measuring apparatus.

The method for using a spectrum ellipsometer uses a principle of a structure birefringence, and calculates a shape of a pattern that is a grating shape with 100 nm or less and is a repetition pattern in a line and space (a line width, a height, and an angle of the sidewall, etc.). Moreover, the method is expected to use a light CD measuring apparatus on a mass production site of a semiconductor manufacturing from a problem of measurement accuracy in a scanning electron microscope of an ArF resist. A means for fabricating a library where RCWA is used beforehand, or a Regression mode etc. that is calculated while only measuring without fabrication are applied.

Figure 13:
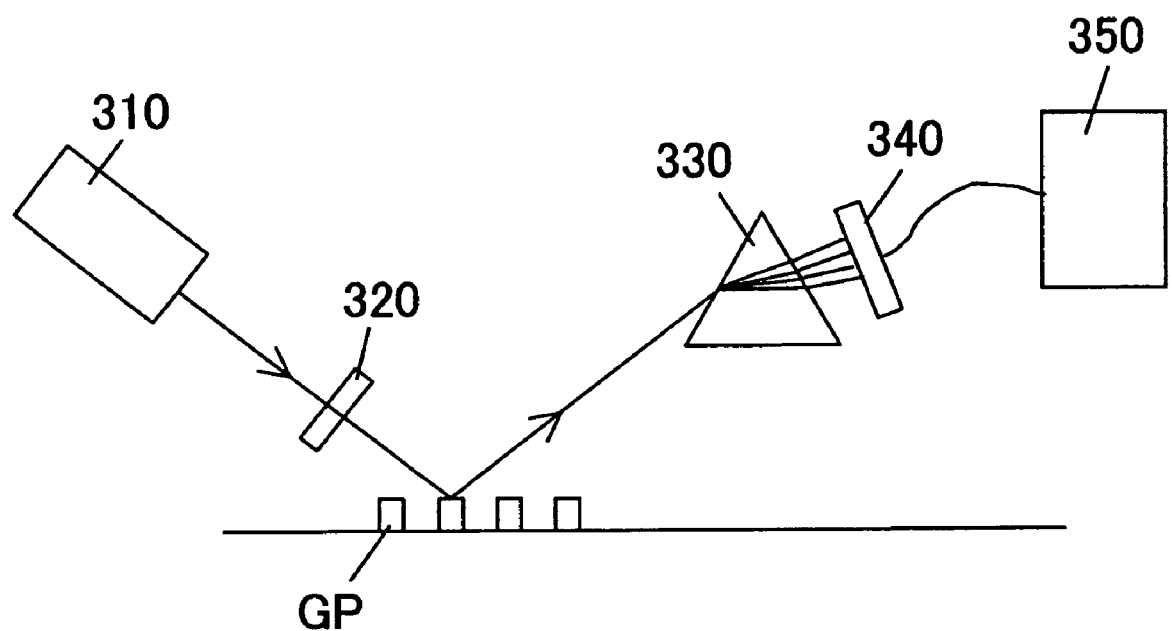
FIG. 13 is a schematic cross sectional view for showing one aspect of construction of a optical CD measuring apparatus.

FIG. 13 is a schematic cross sectional view for showing a structure of a light CD measuring apparatus 300. With reference to FIG. 13, light that is originated from a light source 310 and includes plural wavelengths is adjusted by a polarizer 320 about a state of polarized light (S polarized light and P polarized light) and a phase difference. A beam in which a state of polarized light and a phase is adjusted is incident onto a grating pattern GP at a certain angle. The beam in which the state of the polarized light is changed by the grating pattern GP is incident onto a spectral optical system 330, and is separated for each wavelength. A photoelectric detector 340 detects change of a reflectivity in the separated S and P polarized light of each wavelength, and change of its phase difference. The measurement data is sent to a computer 350.

In a method for making a library beforehand, change in a reflectivity and a phase difference of each wavelength is calculated by a calculation (RCWA) based on optical information of a structure (a refractive index, etc.) and a shape (a line width, a height, and an angle of the sidewall, etc.) in a grating pattern GP assumed beforehand. A library is composed in the plural results that are calculated by the above method within a range of a shape of grating pattern GP that is assumed. The change in the phase difference and the reflectivity of each wavelength that is actually measured are compared with the library, one with the most similar wavelength is selected, and the shape of the grating pattern GP used at that time is output as a result of the measurement. In a regression mode, the library is not previously calculated, and it is calculated during measurement.

The method that uses a spectrum ellipsometer has already been confirmed to be able to measure a shape of a mark with a line and space of 60 nm or less with high accuracy, and high throughput.

Next, a description will now be given of a measurement of a shape of a resist pattern by using an atomic force microscope ("AFM"). An AFM with measurement accuracy below nanometer is examined to be used in mass production semiconductor manufacturing site, and is commercialized because there is also a problem of measurement accuracy in a scanning electron microscope for the same ArF resist that needs introduce a light CD measuring apparatus in the field of a CD measurement.

For example, an AFM (Dimension-X3D) made by Veeco Company can measure aspect ratio up to 10 by measuring a cantilever that extends at a top part of a flare shape by a CD mode that resonates in a measurement direction to not only a perpendicular direction (up and down) but also the right and left directions. A measurement reproducibility in a line width of a pattern is 3σ=0.30 nm as highly accurate result in 30 times measurements in isolation resist pattern of 110 nm.

A correlation with a scanning electron microscope ("SEM") is $R^2=0.96$ in a KrF resist without the problems with measurements using the SEM. It can be confirmed that the CD measurement that uses an AFM that is a highly accurate at nanometer or less, and is a technology that can replace a SEM.

Thus, according to a measurement method 1000, the distortion in the projection optical system of the exposure apparatus that uses a pattern of 100 nm or less can be measured with high accuracy and high throughput by devising an exposure sequence (i.e., two exposures) and a mark pattern to be exposed, and by measuring a shape of a resist pattern after developing. Moreover, the distortion in the projection optical system can be measured by a line width difference of a pattern.

A distortion of the projection optical system by a line width difference of a pattern can be also measured in an exposure of the mark of the X direction and a measurement method by composing a mask similar to the mask of the X direction in a Y direction although a description would be given about only the mark of the X direction of the mark pattern.

Figure 14:
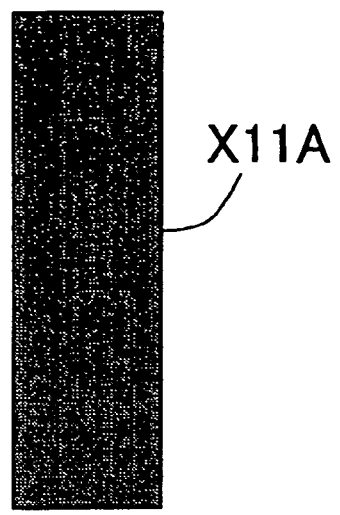
FIG. 14 is a schematic plane view for showing one aspect of a mark exposed at first time.
Figure 14:
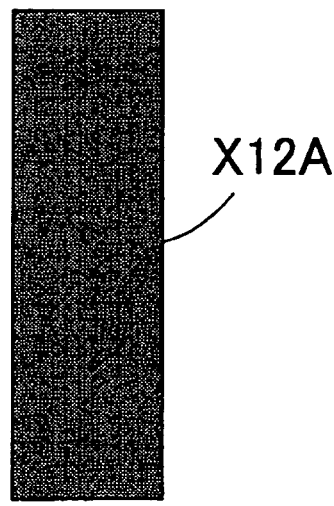
Figure 15:
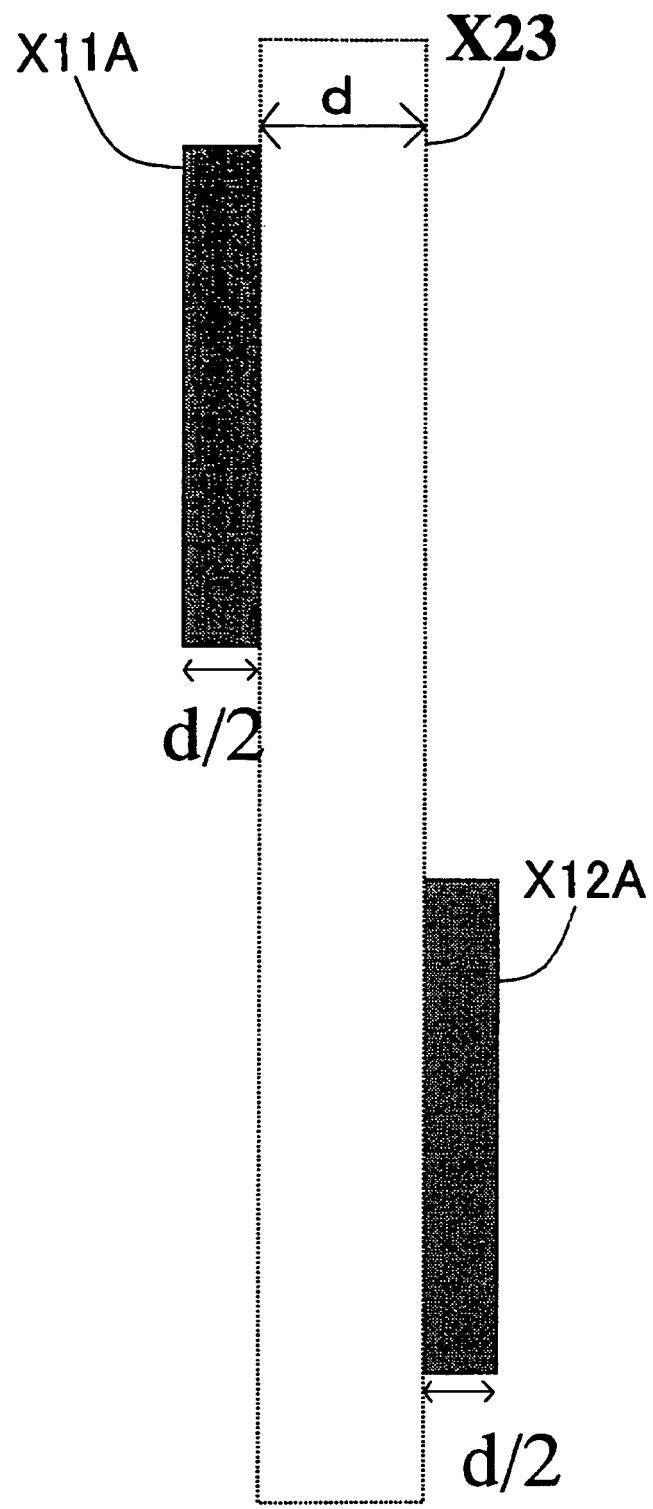
FIG. 15 is a schematic plane view for showing the mark shown in FIG. 14 exposed at second time.

It is also possible to share two pieces and to use it as one mark even though four pieces marks in total are used that include the marks X11 and X12 as a mark exposed at the first time, and the marks X21 and X22 as a mark exposed at second time for measuring a distortion in the X direction. For example, the marks to be exposed at the first time are the marks X11A and X12A (a line width d) as shown in FIG. 14, and one mark that includes the marks to be exposed at the second time is the mark X23 as shown in FIG. 15. An effect of the present invention can be achieved by exposing the mark X23 to be exposed at the second time so as to expose each of the right side and the left side of the marks X11A and X12A exposed at the first time. Here, FIG. 14 is a schematic plane view for showing the marks X11A and X12A to be exposed at the first time. FIG. 15 is a schematic plane view for showing the mark X23 to be exposed at the second time in the marks X12A and X12B to be exposed at the first time.

Figure 16:
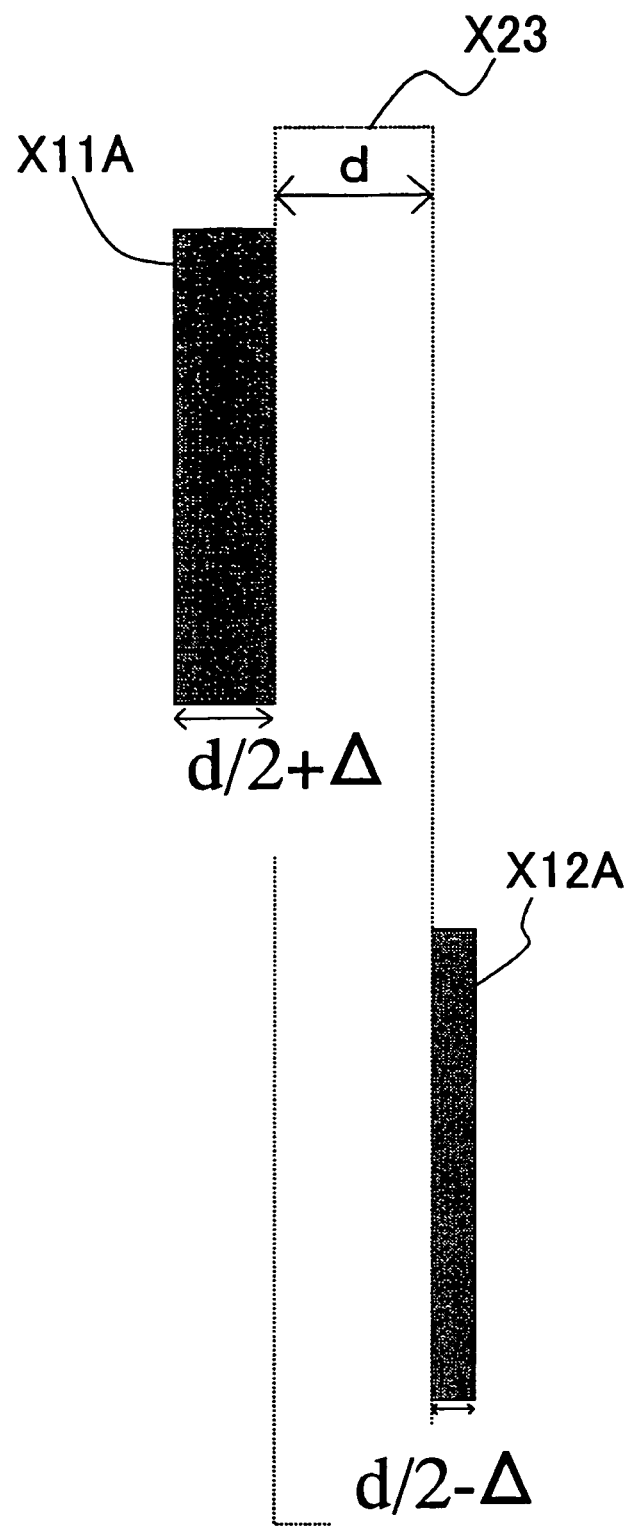
FIG. 16 is a schematic plane view for showing a case of that the mark exposed at second time, as shown in FIG. 14, contains a shear amount.

FIG. 15 shows a resist pattern where the mark X23 to be exposed at the second time is exposed without a shear amount (i.e., the projection optical system does not include a distortion), and is developed. For example, a line width of the resist pattern in the mark X11A is $d/2+\Delta$ as shown in FIG. 16, and a line width of the resist pattern in mark X12A is $d/2-\Delta$ when the mark X23 to be exposed at the second time includes a shear amount $\Delta$ (i.e., the projection optical system includes a distortion). Here, FIG. 16 is a schematic plane view for showing a case of that the mark X23 to be exposed at the second time includes the shear amount in the marks X11A and X12A to be exposed at the first time.

However, it is necessary to satisfy a condition that two marks X11A and X12A to be exposed at the first time are away when a line width of a resist pattern is measured. When this condition is 500 μm or more, a length of the mark X23 to be exposed at the second time needs the same value. In this case, a composition in which the mark X23 is divided into the mark X21 and the mark X22 is difference in only a point where a mark to be not used exists or not between the mark X21 and the mark X22. Thus, it is the same function as the above case. Similarly, the effect of this invention can be also achieved by sharing the marks X11A and X12A to be exposed at the first time, and by replacing a mark to be exposed at the second time into the marks X21 and X22.

This embodiment may not be this ratio although a description would be given about the pattern that is a mark pattern for measuring a distortion of the projection optical system with a ratio of 1:1 and a repeating pitch of P. For example, a ratio of a line and space is 1:x and a repeating pitch is P'. The mark X21 to be exposed at the second time is superimposed on the right side of the mark X11 to be exposed at the first time so as to shift to only $1/\{2\times(1+x)\}$ from the repeating pitch P', and the mark X22 to be exposed at the second time is superimposed on left side of the mark X12 to be exposed at the first time so as to shift to only $1/\{2\times(1+x)\}$ from the repeating pitch P'. In ideal superposition, a line width of the mark X11 doubly exposed with the mark X21 to be exposed at second time is the same as a line width of the mark X12 doubly exposed with the mark X22 to be exposed at the second time in case of a line width of $P'/\{2\times(1+x)\}$. When the projection optical system has a distortion, and the marks X11 and X12 exposed at the first time shift to the left side only $\Delta$ of the distortion, the line width of the mark X11 becomes $P'/\{2\times(1+x)\}+\Delta$, and the line width of the mark X12 becomes $P'/\{2\times(1+x)\}-\Delta$ in the line width after the mark X21 and X22 is superimposed in the second exposure. Therefore, the distortion of the projection optical system can be measured since the distortion amount (shear amount) $\Delta$ is calculated by measuring each of the line widths and by measuring the half of the difference.

Moreover, the present invention can be also applied when a distortion generated between two illumination modes or more is measured in one apparatus. In this case, it is possible to measure not only the distortion similarly generated between the illuminating modes but also change of the line width by exposing it in each of two illuminating modes from plurality, and by exposing the marks X11 and X12 in the first illuminating mode and the marks X21 and X22 in another illuminating mode.

In addition, the present invention can be also applied when the distortion generated between two or more apparatus is measured. In this case, it is possible to measure not only the distortion similarly generated between plural apparatuses but also change the line width by exposing the marks X11 and X12 by an apparatus, and by exposing the marks X21 and X22 by another apparatus by different illuminating modes.

For measuring a distortion, a description is given about the method for exposing and superimposing the mark that is arranged on or near the axis of the projection optical system onto each mark within an angle of field at the first exposure by driving a reticle stage controlled by an interference measurement system in the second exposure, and for exposing an angle of field that can be exposed at the first exposure.

However, the effect of the present invention can be achieved in mere a superposition exposure. In that case, the marks X11 and X12 to be exposed at the first time are arranged in an area (a shot) that can be exposed by an exposure apparatus with a pitch for measuring a distortion. The marks X21 and X22 to be exposed at the second time are arranged on the neighborhood of the marks X11 and X12 to be exposed at the first time with the same number and pitch of the marks to be exposed at the first time. Moreover, the mark of a grating shape to be exposed at the first time and the mark to be exposed at the second time are the same pitch, and the line width of the mark to be exposed at the second time is thicker than the length of the mark to be exposed at the first time. In exposure, the first exposure exposes a whole area of a shot, and the second exposure exposes a whole area of a shot that is shifted so as to superimpose the mark of the first mark. As a result, the shear amount between the mark to be exposed at the first time and the mark to be exposed at the second time in an angle of field in the shot is a difference of the distortion in each line width. The difference from the line width of the distortion in each angle of field in the shot can be determined by measuring this.

The present invention also includes a measurement apparatus that has the above mark pattern, or has a measurement mode that can execute the above measurement method.

Figure 17:
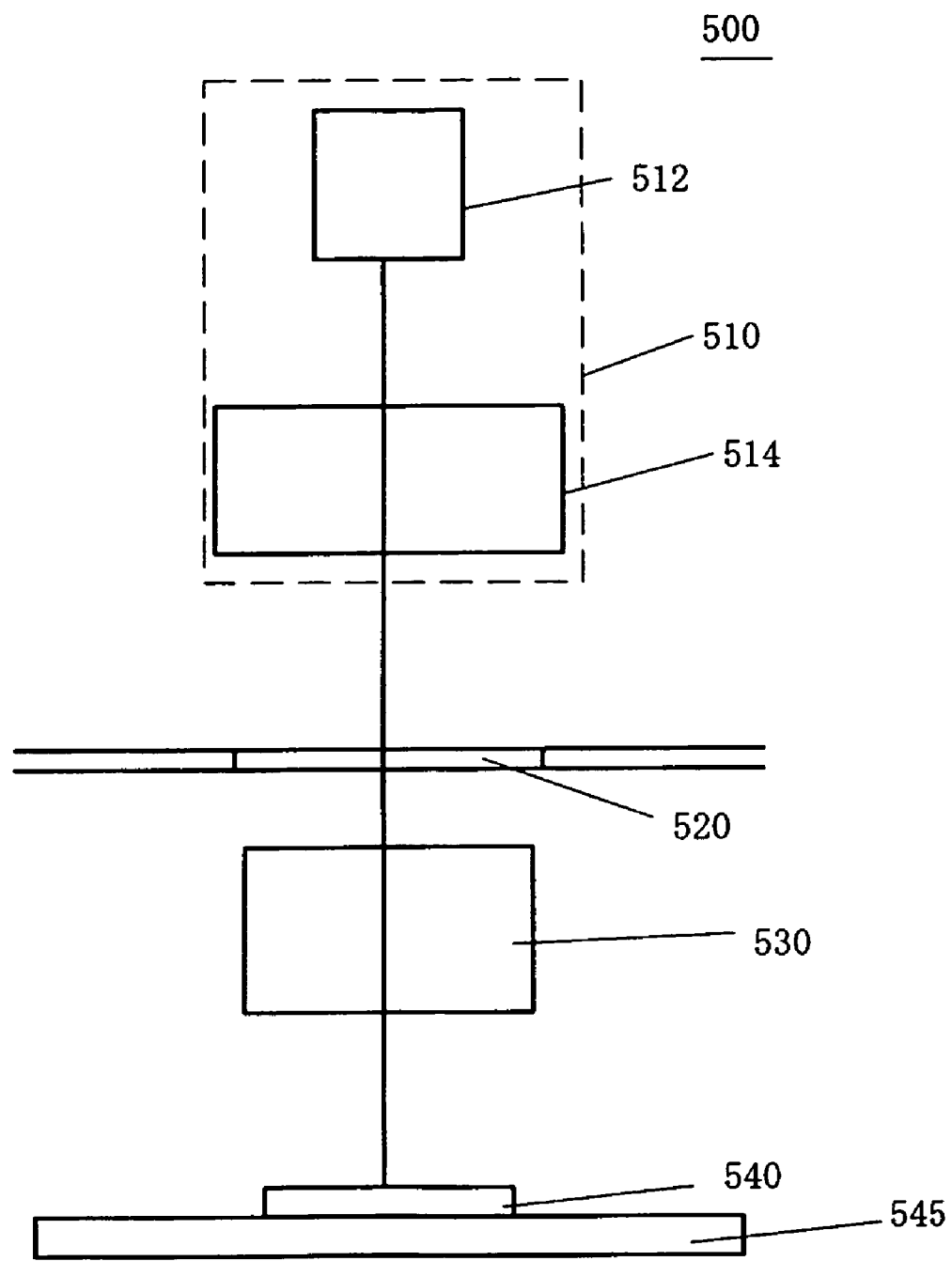
FIG. 17 is a schematic block view for showing an exposure apparatus of one aspect of the present invention.

Referring now to FIG. 17, a description will be given of the exposure apparatus 500 that including the measurement method 100 according to the present invention. Here, FIG. 17 is a schematic sectional view of the exposure apparatus 500 as one aspect according to the present invention. The exposure apparatus 500 includes, as shown in FIG. 17, an illumination apparatus 510 for illuminating a reticle 520 which forms a circuit pattern, a projection optical system 530 that projects diffracted light created from the illuminated reticle pattern onto a plate 540, and a stage 545 for supporting the plate 540.

The exposure apparatus 500 is a projection exposure apparatus that exposes onto the plate 540 a circuit pattern created on the reticle 520, e.g., in a step-and-repeat or a step-and-scan manner. Such an exposure apparatus is suitable for a submicron or quarter-micron lithography process. This embodiment exemplarily describes a step-and-scan exposure apparatus (which is also called "a scanner"). The "step-and-scan manner", as used herein, is an exposure method that exposes a reticle pattern onto a wafer by continuously scanning the wafer relative to the reticle, and by moving, after an exposure shot, the wafer stepwise to the next exposure area to be shot. The "step-and-repeat manner" is another mode of exposure method that moves a wafer stepwise to an exposure area for the next shot, for every cell projection shot.

The illumination apparatus 510 which illuminates the reticle 520 that forms a circuit pattern to be transferred, includes a light source unit 512 and an illumination optical system 514.

As an example, the light source unit 512 uses a light source such as ArF excimer laser with a wavelength of approximately 193 [nm] and KrF excimer laser with a wavelength of approximately 248 [nm]. However, the laser type is not limited to excimer lasers because, for example, $F_2$ laser with a wavelength of approximately 157 [nm], Extreme ultraviolet (EUV) light of approximately 10-20 [nm] and a YAG laser may be used. Similarly, the number of laser units is not limited. For example, two independently acting solid lasers would cause no coherence between these solid lasers and significantly reduces speckles resulting from the coherence. An optical system for reducing speckles may swing linearly or rotationally. When the light source unit 512 uses laser, it is desirable to employ a beam shaping optical system that shapes a parallel beam from a laser source to a desired beam shape, and an incoherently turning optical system that turns a coherent laser beam into an incoherent one. A light source applicable for the light source unit 512 is not limited to a laser, and may use one or more lamps such as a mercury lamp and a xenon lamp.

The illumination optical system 514 is an optical system that illuminates the reticle 520, and includes a lens, a mirror, a light integrator, a stop, and the like, for example, a condenser lens, a fly-eye lens, an aperture stop, a condenser lens, a slit, and an image-forming optical system in this order. The illumination optical system 514 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive element. A stop may be composed as a ring band lighting diaphragm and a four-fold pole illumination diaphragm for a transformation illumination which improves a resolution.

The reticle 520 is made, for example, of quartz, forms a circuit pattern (or an image) to be transferred, and is supported and driven by a mask stage (not shown). Diffracted light emitted from the reticle 520 passes through the projection optical system 530 and is then projected onto the plate 540. The reticle 520 and the plate 540 are located in an optically conjugate relationship. Since the exposure apparatus 500 of this embodiment is a scanner, the reticle 520 and the plate 540 are scanned at the speed ratio of the reduction ratio of the projection optical system 530, thus transferring the pattern from the reticle 520 to the plate 540. If it is a step-and-repeat exposure apparatus (referred to as a "stepper"), the reticle 520 and the plate 540 remains still when exposing the mask pattern.

The projection optical system 530 may use an optical system comprising solely of a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit.

The above measurement method 100 and the measurement apparatus according to the present invention measure a distortion of the projection optical system 530, and the projection optical system 530 is adjusted to have a determined optical performance. A detailed explanation of the measurement method 100 and the measurement apparatus is omitted because it was disclosed. Therefore, the projection optical system 530 can obtain a determined optical performance because it can suppress a distortion to the utmost limit by measuring and adjusting the distortion repeatedly. The exposure apparatus 500 may include the above measurement apparatus and an adjuster for adjusting the projection optical system based on the distortion measured by the measurement apparatus, and may execute the measurement method 100.

The plate 540, such as a wafer and a LCD, is an exemplary object to be exposed. Photoresist is applied to the plate 540.

The stage 545 supports the plate 540. The stage 545 may use any structure known in the art, thus, a detailed description of its structure and operation is omitted. The stage 545 may use, for example, a linear motor to move the plate 540 in the XY directions. The reticle 520 and plate 540 are, for example, scanned synchronously, and the positions of the stage 545 and a mask stage (not shown) are monitored, for example, by a laser interferometer and the like, so that both are driven at a constant speed ratio. The stage 545 is installed on a stage stool supported on the floor and the like, for example, via a dampener. The mask stage and the projection optical system 530 are installed on a lens barrel stool (not shown) support, for example, via a dampener, to the base frame placed on the floor.

In exposure, light is emitted from the light source 512, e.g., Koehler-illuminates the reticle 520 via the illumination optical system 514. Light that passes through the reticle 520 and reflects the mask pattern is imaged onto the plate 540 by the projection optical system 530. The projection optical system 530 of the exposure apparatus 500 provides high-quality devices (such as semiconductor devices, LCD devices, photographing devices (such as CCDs, etc.), thin film magnetic heads, and the like) with high throughput and economic efficiency since it suppresses a distortion to the utmost limit.

Figure 18:
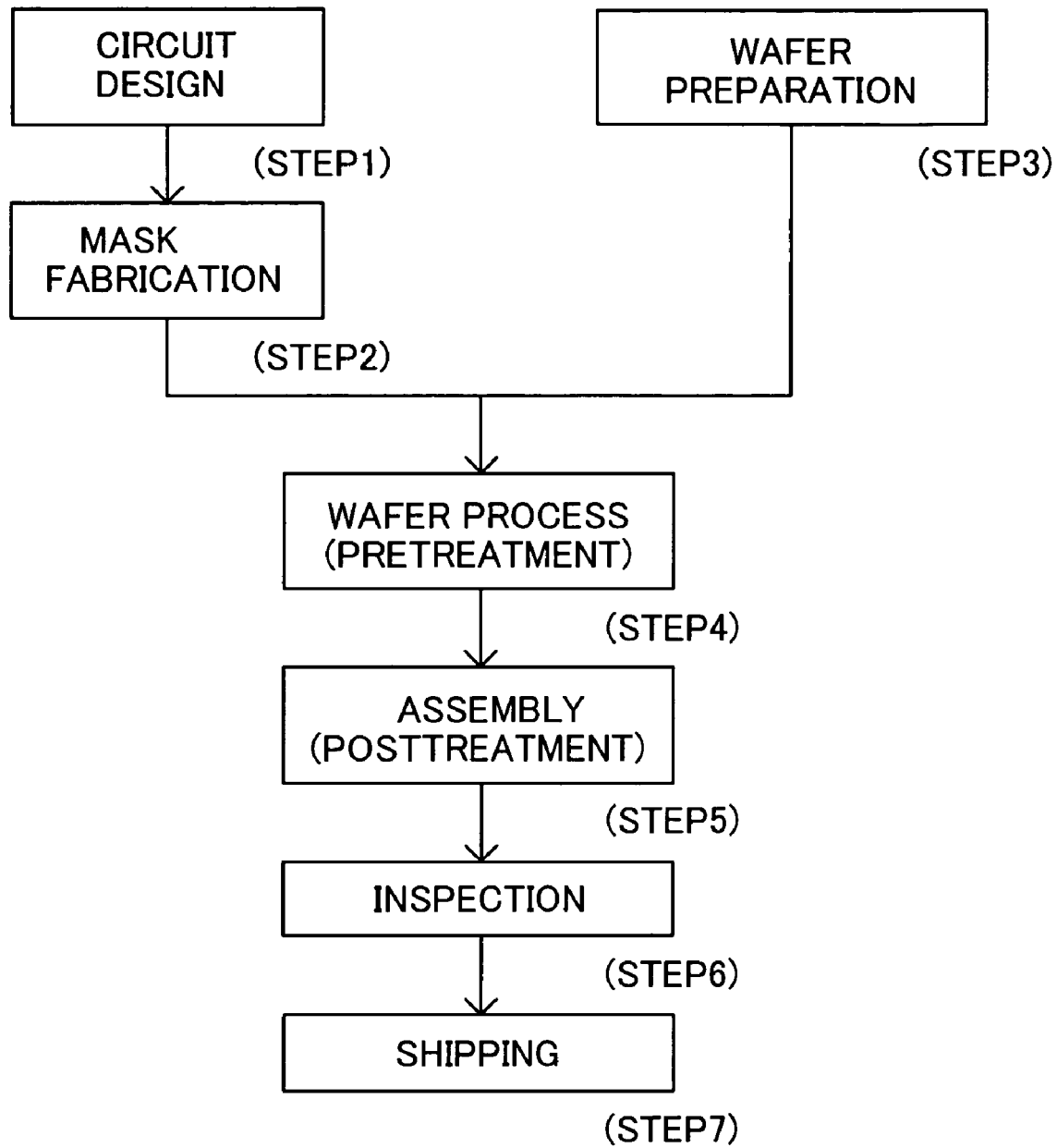
FIG. 18 is a flowchart for explaining how to fabricate devices (such as semiconductor chips such as ICs and LCDs, CCDs, and the like).
Figure 19:
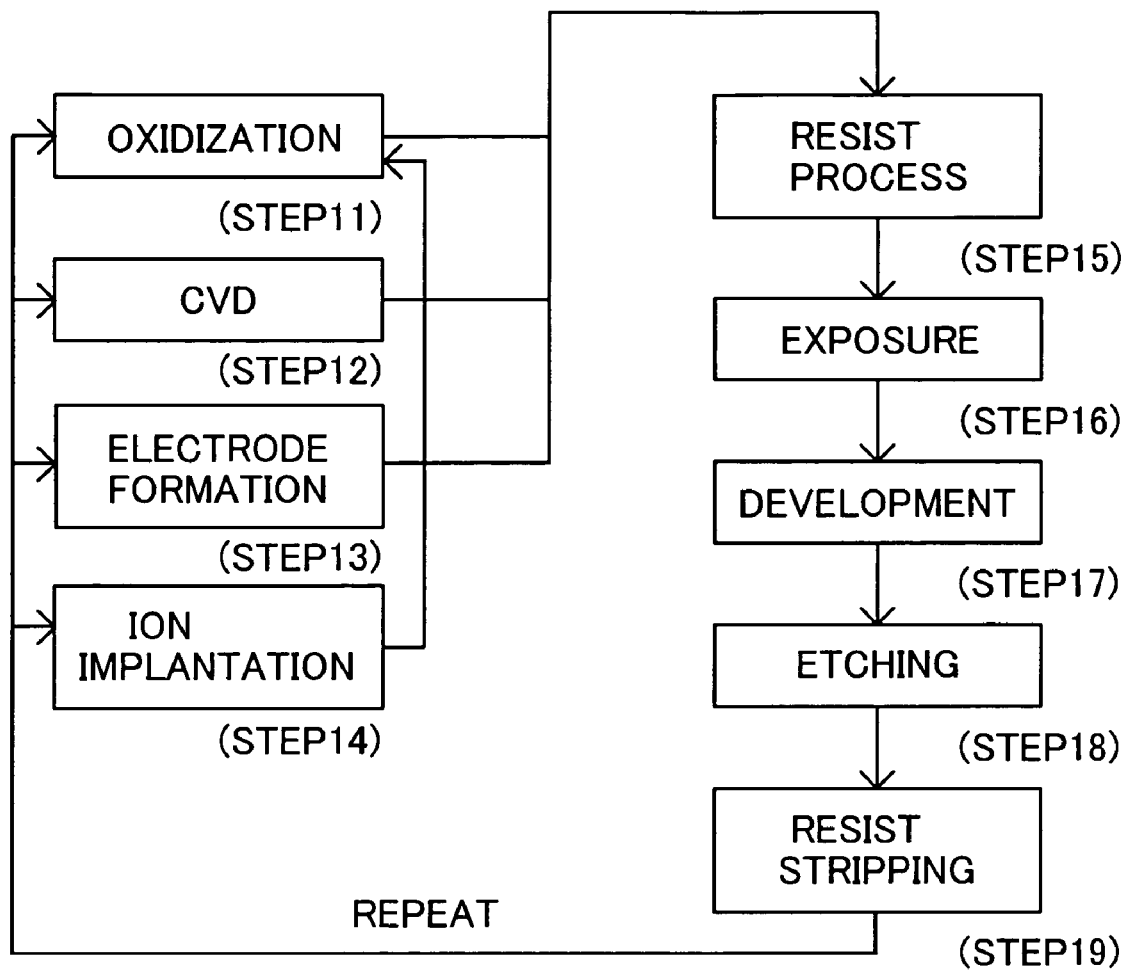
FIG. 19 is a detail flowchart of a wafer process as Step 4 shown in FIG. 18.

Referring now to FIGS. 18 and 19, a description will be given of an embodiment of a device fabrication method using the above mentioned exposure apparatus 500. FIG. 18 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 19 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 500 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Use of the fabrication method in this embodiment helps fabricate higher-quality devices than conventional methods. Thus, the device fabrication method using the exposure apparatus 500, and resultant devices constitute one aspect of the present invention.

It is an exemplary object of the present invention to provide a measurement method, a measurement apparatus, an exposure apparatus and a device fabrication method, the measurement method being able to inspect a measurement of a distortion in a projection optical system of an exposure apparatus that uses the pattern of 100 nm or less with highly accurate and a high throughput, and achieves a measurement of a distortion by a line width difference of the pattern of a projection optical system.

Furthermore, the present invention is not limited to these preferred embodiments and various variations and modifications may be made without departing from the scope of the present invention.

This application claims a foreign priority benefit based on Japanese Patent Applications No. 2004-166695, filed on Jun. 4, 2004, which is hereby incorporated by reference herein in its entirety as if fully set forth herein.

What is claimed is:

1. A measurement method for measuring a distortion of a projection optical system that projects a reticle pattern, which can include a plurality of first marks and a plurality of second marks, wherein the projection optical system is usable by an exposure apparatus that exposes the reticle pattern onto an object, said measurement method comprising:
   a first exposing step of exposing the plurality of first marks onto the object, the plurality of first marks being arranged on or near an optical axis of the projection optical system and beside the optical axis;
   a second exposing step of exposing at least one of the plurality of second marks onto the object on or near the optical axis of the projection optical system;
   a measuring step of measuring a line width of a mark formed on the object via the first exposing step and the second exposing step with an ellipsometer; and
   a calculating step of calculating the distortion of the projection optical system from the line width of the mark measured in the measuring step,
   wherein at least one of the first marks has two first repeating patterns, each of which includes third marks as shading parts that are repeatedly arranged, the two first repeating patterns being arrayed in a direction orthogonal to a direction along which the third marks are repeating, and
   wherein the at least one second mark has two second repeating patterns, each of which includes fourth marks as penetrating parts that are repeatedly arranged, the two second repeating patterns being arranged so that the two first repeating patterns exposed in the first exposing step are shifted in a direction opposite to each other in a direction along which the fourth marks are repeating.

2. A measurement method according to claim 1, wherein the plurality of second marks are arranged on or near the optical axis and beside the optical axis, and the second exposing step exposes all of the plurality of second marks.

3. A measurement method according to claim 1, wherein each of the first and second marks includes four repeating patterns, two of which are repeatedly arrayed in a first direction and the other two of which are repeatedly arrayed in a second direction, which is perpendicular to the first direction.

4. A measurement method according to claim 1, wherein the calculating step defines a half of a difference in the line width of the mark formed on the object as a distortion of the projection optical system.

5. A device fabrication method comprising the steps of:
   exposing an object using an exposure apparatus; and
   performing a predetermined process to the object exposed in the exposing step,
   wherein the exposing step exposes a reticle pattern, which can include a plurality of first marks and a plurality of second marks, onto the object using said exposure apparatus, said exposure apparatus comprising a projection optical system configured to project the pattern onto the object, a measurement apparatus configured to measure a distortion of said projection optical system, and an adjustor configured to adjust said projection optical system based on a measurement result of said measurement apparatus, and
   wherein said measurement apparatus measures a distortion of said projection optical system that projects the reticle pattern, said measurement apparatus being configured to execute a measurement-mode method comprising:
   a first exposing step of exposing the plurality of first marks onto the object, the plurality of first marks being arranged on or near an optical axis of the projection optical system and beside the optical axis;
   a second exposing step of exposing at least one of the plurality of second marks onto the object on or near the optical axis of the projection optical system;
   a measuring step of measuring a line width of a mark formed on the object via the first exposing step and the second exposing step with an ellipsometer; and
   a calculating step of calculating the distortion of the projection optical system from the line width of the mark measured in the measuring step,
   wherein at least one of the plurality of first marks has two first repeating patterns, each of which includes third marks as shading parts that are repeatedly arranged, the two first repeating patterns being arrayed in a direction orthogonal to a direction along which the third marks are repeating, and wherein the at least one second mark has two second repeating patterns, each of which includes fourth marks as penetrating parts that are repeatedly arranged, the two second repeating patterns being arranged so that the two first repeating patterns exposed in the first exposing step are shifted in a direction opposite to each other in a direction along which the fourth marks are repeating.

* * * * *